United States Patent
You et al.

(10) Patent No.: US 6,703,871 B2
(45) Date of Patent: Mar. 9, 2004

(54) AMPLIFIER FOR USE IN SEMICONDUCTOR INTEGRATED CIRCUITS

(75) Inventors: Min-Young You, Cheongju-shi (KR); Nam-Gyu Ryu, Cheongju-shi (KR)

(73) Assignee: Hyundai Electronics Industries Co., Ltd., Kyounki-Do (KR)

( * ) Notice: Subject to any disclaimer, the term of this patent is extended or adjusted under 35 U.S.C. 154(b) by 0 days.

(21) Appl. No.: 10/061,372

(22) Filed: Feb. 4, 2002

(65) Prior Publication Data

US 2002/0070762 A1 Jun. 13, 2002

Related U.S. Application Data

(62) Division of application No. 09/461,413, filed on Dec. 16, 1999, now Pat. No. 6,359,473.

(30) Foreign Application Priority Data

Dec. 16, 1998 (KR) ........................................ 1998-55466

(51) Int. Cl.[7] .............................................. G01R 19/00
(52) U.S. Cl. ......................................... 327/52; 327/57
(58) Field of Search ............................... 327/50–55, 57, 327/65, 333; 326/68, 81; 365/205, 207

(56) References Cited

U.S. PATENT DOCUMENTS

| | | | |
|---|---|---|---|
| 4,634,900 A | 1/1987 | Koshizuka | 327/52 |
| 4,843,264 A * | 6/1989 | Galbraith | 327/55 |
| 5,130,581 A * | 7/1992 | Oh et al. | 327/55 |
| 5,233,558 A | 8/1993 | Fuji et al. | 365/207 |
| 5,345,121 A * | 9/1994 | Itoh | 327/55 |
| 5,377,150 A | 12/1994 | McClure | 327/51 |
| 5,471,160 A | 11/1995 | Higaki | 327/51 |
| 5,473,567 A | 12/1995 | McClure | 327/53 |
| 5,487,048 A | 1/1996 | McClure | 365/207 |
| 5,526,314 A * | 6/1996 | Kumar | 365/207 |
| 5,565,808 A | 10/1996 | Lo | 327/211 |
| 5,821,824 A | 10/1998 | Mentzer | 327/52 |
| 5,854,562 A | 12/1998 | Toyoshima et al. | 327/55 |
| 5,912,853 A * | 6/1999 | Rao | 365/205 |
| 5,977,798 A * | 11/1999 | Zerbe | 326/98 |
| 5,982,690 A * | 11/1999 | Austin | 365/205 |
| 6,064,613 A | 5/2000 | Wang | 327/54 |
| 6,127,854 A | 10/2000 | Illegems | 327/66 |
| 6,169,434 B1 * | 1/2001 | Portmann | 327/51 |
| 6,172,535 B1 | 1/2001 | Hopkins | 327/66 |
| 6,359,473 B1 * | 3/2002 | You et al. | 327/52 |

* cited by examiner

*Primary Examiner*—Long Nguyen
(74) *Attorney, Agent, or Firm*—Fleshner & Kim, LLP

(57) ABSTRACT

An amplifier in a semiconductor integrated circuit includes a current-mirror typed differential amplifier and a cross-coupled differential amplifier, whereby a minute voltage difference from a bit line signal or a data bus signal is amplified. The amplifier for generating an amplified signal includes a load for coupling to a first voltage potential, a first sense amplifier responsive to a first data signal, and a second sense amplifier responsive to a second data signal. The first and second sense amplifiers are commonly coupled to the load, and the amplified signal of the first or second data signal is generated.

10 Claims, 9 Drawing Sheets

AMPLIFIER FOR USE IN SEMICONDUCTOR INTEGRATED CIRCUITS

CROSS-REFERENCE TO RELATED APPLICATIONS

This application is a divisional of U.S. patent application Ser. No. 09/461,413, filed on Dec. 16, 1999, which is now U.S. Pat. No. 6,359,473. The contents of this patent and patent application are incorporated herein by reference.

BACKGROUND OF THE INVENTION

1. Field of the Invention

The present invention relates to an amplifier and more particularly, a sense amplifier for a memory device.

2. Background of the Related Art

One of the important factors in the semiconductor field is to operate a device at a high speed. One of the ways to increase the operating speed is to decrease the voltage level of a signal. Since a signal of low voltage level has a small swinging width, the transition of a logic state is fast. Although the voltage level of a signal is lowered to obtain a fast operation speed, the signal needs to be amplified eventually to a magnitude large enough to drive a load, especially when the signal is transferred through a very long signal line. In other words, the voltage level has to be amplified sufficiently.

FIG. 1 shows a schematic of a data output path for semiconductor memory according to a related art. Bit line sense amplifier circuits 104 and 108 of a DRAM in FIG. 1 amplify a minute voltage difference between each bit line pair BL and /BL connected to memory cell arrays 102 and 106 to data buses DB and /DB. Signals of the data buses DB and /DB are amplified by data bus sense amplifier circuits 110 and 112 and transferred to read data lines RDL and /RDL. The signals of the read data lines are carried to a data output pad through a read data driver and a data output buffer.

As memory capacity increases, so does the area of a memory cell array also increases. Thus, the length of the bit lines or data buses becomes longer. Accordingly, when an output of a bit line sense amplifier is connected directly to a read data line RDL or /RDL, it is hard to expect a fast amplifying operation from the sense amplifier due to the large load on the bit line sense amplifier. Instead, the load on the bit line is alleviated by amplifying the signal which has been amplified by the bit line sense amplifier with a data bus sense amplifier located on the data bus.

The bit line sense amplifier circuit 104 and 108 include a plurality of bit line sense amplifiers, each sense amplifier for a pair of bit lines BL and /BL. The data bus sense amplifier circuit 110 and 112 includes a plurality of sense amplifiers each for a pair of data buses DB and /DB.

FIG. 2 shows a circuit of a current mirror typed sense amplifier used for a semiconductor integrated circuit in a related art. Referring to FIG. 2, two PMOS transistors 202 and 204 connected to a power supply voltage VDD are an example of a current mirror typed load 200. Both gates of the PMOS transistors 202 and 204 are connected to a drain of the PMOS transistor 202.

Two NMOS transistors 206 and 208, serving as driving transistors, are connected to the PMOS transistors 202 and 204, respectively. The NMOS transistor 206 is driven by a data bus signal DB and the NMOS transistor 208 is driven by a data bus bar signal /DB which is a complementary signal of the data bus signal DB. Both of the NMOS transistors 206 and 208 are connected to a current source formed by NMOS transistor 210, which is activated by a sense amplifier enabling signal SAE.

Each current passing by nodes 212 and 214 is equal to each other because of the current mirror typed load 200. Thus, the current sinking through the NMOS transistor 210 of the current source to a ground VSS is constant. The current passing through the NMOS transistors 206 and 208 depends on voltage levels of the data bus signal DB and the data bus bar signal /DB, respectively.

When the voltage level of the data bus signal DB is higher than that of the data bus bar signal /DB (even though the difference is very small), drain-source current IDS of the NMOS transistor 206 increases relatively to lower the voltage at the node 212. On the other hand, drain-source current $I_{DS}$ of the NMOS transistor 208 decreases while voltage of the node 214 rises. Accordingly, the voltage difference between a pair of the data bus signals DB and /DB is amplified to a level of the power source voltage VDD.

FIG. 3 shows a circuit of a sense amplifier including two differential amplifiers connected in parallel to generate complementary outputs. A data bus signal DB and a data bar signal /DB are cross-coupled to both a first differential amplifier 420 and a second differential amplifier 422. The differential amplifiers 420 and 422 produce complementary outputs OUT and /OUT. In the first differential amplifier 420, a driving NMOS transistor 406 is driven by the data bus signal DB, and a first output OUT is generated from a drain thereof. The other driving NMOS transistor 408 is driven by the data bus bar signal /DB.

In the second differential amplifier 422, a driving NMOS transistor 418 is driven by the data bus bar signal /DB, and a second output /OUT, which is complementary to the first output OUT, is generated from a drain thereof. The other driving NMOS transistor 416 is driven by the data bus signal DB. The two differential amplifiers are for a single sense amplifier, which provides complementary outputs OUT and /OUT based on complementary data bias signal DB and data bus bar signal /DB.

FIG. 4 shows a circuit of a cross-coupled differential amplifier in a semiconductor integrated circuit which is generally used in a related art as a sense amplifier in semiconductor memory. Referring to FIG. 4, two PMOS transistors 602 and 604 are connected to a power supply voltage VDD in parallel and are cross-coupled type loads. Gates of the PMOS transistors 602 and 604 are connected to the drains of reciprocal PMOS transistors 604 and 602, respectively.

These two PMOS transistors 602 and 604, as the load, are connected to NMOS transistors 606 and 608 as driving transistors, respectively. The driving NMOS transistor 606 is driven by a data bus signal DB and the driving NMOS transistor 608 is driven by a data bus bar signal /DB. Both of the NMOS transistors 606 are connected to another NMOS transistor 610 which is a current source. The NMOS transistor 610, which serves as a current source, is activated by a sense amplifier enabling signal SAE.

When the sense amplifier enabling signal SAE is activated to high level, drain-source current $I_{DS}$ of the NMOS transistor 606 is larger than the other drain-source current $I_{DS}$ of the other NMOS transistor 608. Therefore, the voltage level of the data bus signal DB which drives the NMOS transistor 606 is higher than the voltage level of the data bus bar signal /DB of the NMOS transistor 608 to the height of the minute voltage difference ΔV, which is very short. Accordingly, the voltage level of the second output /OUT is lower than the voltage level of the first output OUT.

The voltage of the first output OUT rises until a gate-source voltage $V_{GS}$ of the PMOS transistor 602 becomes greater than VDD+VTP (a threshold voltage). Then, the PMOS transistor 602 is turned off. Accordingly, the second output /OUT drops down to 0 volt VSS. Once the voltage of the second output /OUT falls down to 0 volt, and the gate-source voltage $V_{GS}$ drops under VDD+VTP. Thus, the first output OUT rises up to VDD.

In accordance with such amplification, the minute voltage difference ΔV between the data bus signal DB and the data bus bar signal /DB are amplified to the level of the power supply voltage VDD.

It is the present trend in semiconductor memory to use a lower power supply voltage of 3.3V instead of 5V. Thus, the voltage level of a data bus signal is lower to be closer to the power supply voltage of 3.3V. Accordingly, a sense amplifier using a related current mirror typed differential amplifier is unable to provide a sufficient gain, and its operation speed is unfortunately decreased. In order to make up for these deficiencies, a level shifting is required by which an input voltage level of the differential amplifier is lowered to VDD/2 for maximizing the gain. A level shifter is discussed below for providing amplification at high speed using positive feed-back.

FIG. 5 shows a circuit of a sense amplifier including a level shifter 828 and a current mirror type differential amplifier 830. The level shifter 828 includes driving NMOS transistors 802 and 804, a first load 822 and a current source 810. The driving NMOS transistor 802 is driven by a data bus signal DB, and the driving NMOS transistor 804 is driven by a data bus bar signal /DB. The driving NMOS transistors 802 and 804 control voltage to limit a first internal output node 832 or a second internal output node 834 to a level of VDD/2, and have a relatively high threshold voltage VTN.

The first load 822, in which actual amplification is carried out, includes two load NMOS transistors 806 and 808. When the sense amplifier enabling signal SAE is activated, a drain-source current $I_{DS}$ of the driving NMOS transistor 802 is larger than the drain-source current $I_{DS}$ of the driving NMOS transistor 804. Therefore, the voltage level of the data bus signal DB which drives the driving NMOS transistor 802 is a voltage difference ΔV higher than that of the data bus bar signal /DB of the driving NMOS transistor 804. Accordingly, the voltage at the first internal output node 832 is relatively higher than the voltage at the second internal output node 834.

The voltage of the first internal output node 832 rises until the threshold voltage of the NMOS transistor 808 exceeds VTN. Then, the NMOS transistor 808 is turned off. Accordingly, voltage of the second internal output node 834 drops down to 0 volt. Once the voltage of the second internal output node 834 drops to 0 volt, the NMOS transistor 806 is turned off. Thus, the voltage of the first internal output node 832 rises up to VDD/2. Namely, the small voltage difference ΔV between the data bus signal DB and the data bus bar signal /DB is amplified up to VDD/2. The voltage difference ΔV becomes the voltage difference between a first internal output OUT" and a second internal output /OUT".

The current mirror type differential amplifier 830 amplifies the first internal output OUT" and the second internal output /OUT" outputted from the level shifter 828. Gates of the load PMOS transistors 812 and 814 are connected to a drain of the load PMOS transistor 812.

Two driving NMOS transistors 816 and 818 connected to the load PMOS transistors 812 and 814, respectively. The NMOS transistor 816 is driven by the first internal output OUT", and the NMOS transistor 818 is driven by the second internal output /OUT". The driving NMOS transistors 816 and 818 are connected to the NMOS transistor 820, which operates as the current source and is activated by a sense amplifier enabling signal SAE. Each current passing through two nodes 836 and 838 is equal to each other because of the current mirror type load 826. Thus, the current sinking through the NMOS transistor 820 to a ground VSS remains constant.

Each current passing through the driving NMOS transistors 816 and 818 depends on voltage levels of the first and second internal outputs OUT" and /OUT", respectively. When the voltage level of the first internal output OUT" is higher than the voltage level of the second internal output /OUT", the drain-source current $I_{DS}$ of the driving NMOS transistor 816 increases relatively to lower the voltage at the node 836.

On the other hand, drain-source current $I_{DS}$ of the driving NMOS transistor 818 lessens relatively, while voltage at the node 838 rises. Accordingly, small voltage differences between the first and second internal outputs OUT" and /OUT" are amplified to a level of the power source voltage VDD.

As mentioned in the above description, the technology for increasing the integrity of a semiconductor chip has been developed successfully to support a large number of memory cells in a chip. Thus, the number of the bit line sense amplifiers and the data bus sense amplifiers is large.

Accordingly, in order to maximize the benefit of the increased number of memory cells integrated on a unit area, the area occupied by the unit bit line sense amplifier and the data bus sense amplifier should decrease. The integrity of a memory cell array increases remarkably by decreasing the area of the sense amplifiers since the area greatly affects a pitch of the memory cell.

SUMMARY OF THE INVENTION

An object of the present invention is to substantially obviate one or more of the problems due to limitations and disadvantages of the related art.

Another object of the present invention is to reduce the size of the sense amplifiers.

Still another object is to have a common load for at least two sense amplifiers.

A further object of the present invention is to improve sense amplifier based on a current-mirror typed differential amplifier or a cross-coupled differential amplifier.

To achieve these and other advantages and in accordance with the purpose of the present invention, as embodied and broadly described, the present invention for generating an amplified signal includes a load for coupling to a first voltage potential, a first driver circuit coupled to the load and controlled by a first data signal, and a second driver coupled to the load and controlled by a second data signal. The first and second drivers are commonly coupled to the load and the amplified signal of the first or second data signal is generated.

In another aspect of this embodiment, the load is a current mirror type and the amplified signal is a single output. In yet another aspect of this embodiment, the load is cross-coupled and the output is a signal which represents a logic value and a complement of the logic value. In still another aspect of this embodiment, the first driver has a first current source controlled by a first control signal and the second driver has a second current source controlled by a second control signal. In yet still another aspect of this embodiment, the first control signal is activated by a generation of the first data signal and the second control signal is activated by a generation of the second data signal.

In a further aspect of this embodiment, the first and second control signals are generated by an address transition detection signal. In yet a further aspect of this embodiment, a length of a signal line between the first driver and the first current source is equal to a length of another signal line between the second driver and the second current source. In still a further aspect of this embodiment, in the first current source, drains of first and second MOS transistors are connected to the first driver, a drain and source of a third MOS transistor are connected to the drain of the first MOS transistor and the drain of the second MOS transistor, respectively, and the first, second and third transistors are controlled by the first control signal, and in the second current source, drains of fourth and fifth MOS transistors are connected to the second driver, a drain and source of a sixth MOS transistor are connected to the drain of the fourth MOS transistor and the drain of the fifth MOS transistor, respectively, and the fourth, fifth and sixth transistors are controlled by the second control signal. In yet still a further aspect of this embodiment, the first driver includes at least one first driver unit and the second driver includes at least one second driver unit.

In another embodiment, the present invention includes a first load, a second load, a first amplifier, and a second amplifier. The first amplifier further includes a first driver supplied with a first data signal, and a second driver supplied with a second data signal. A first or second output which is an amplified signal of the first data signal is generated by having the first and second drivers own or be commonly connected to the second load. The second amplifier further includes a third driver controlled by the first data signal, and a fourth driver controlled by the second data signal. A first or second output which is an amplified signal of the second data signal is generated by having the third and fourth drivers commonly connected to the second load.

In a further embodiment, the present invention includes a level shifter, and an amplifier. The level shifter further includes a first load, a first driver controlled by a first data signal, and a second driver controlled by a second data signal. The first and second driver own the first load in common, and a first output is generated by changing a signal level of the first or second data signal. The amplifying means further includes a second load, and a third driver controlled by the first output. A second output is generated by amplifying a signal level of the first output.

The present invention can be achieved in a whole or in parts by an amplifier including a load for coupling to a first voltage potential, a first sense amplifier responsive to a first data signal, and a second sense amplifier responsive to a second data signal. The first and second sense amplifiers are commonly coupled to the load.

The present invention can also be achieved in a whole or in parts by an amplifier including a level shifter and an amplifying unit. The level shift includes: a first driver unit for limiting the level of a first voltage potential, a first load coupled to the first driver for amplifying a voltage difference, a first current source coupled to the first load and enabled by a first control signal, and a second current source coupled to the first load and enabled by a second control signal. The amplifying unit includes a second load for coupling to the first voltage potential, and a sense amplifier responsive to an output of the level shifter.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 6:
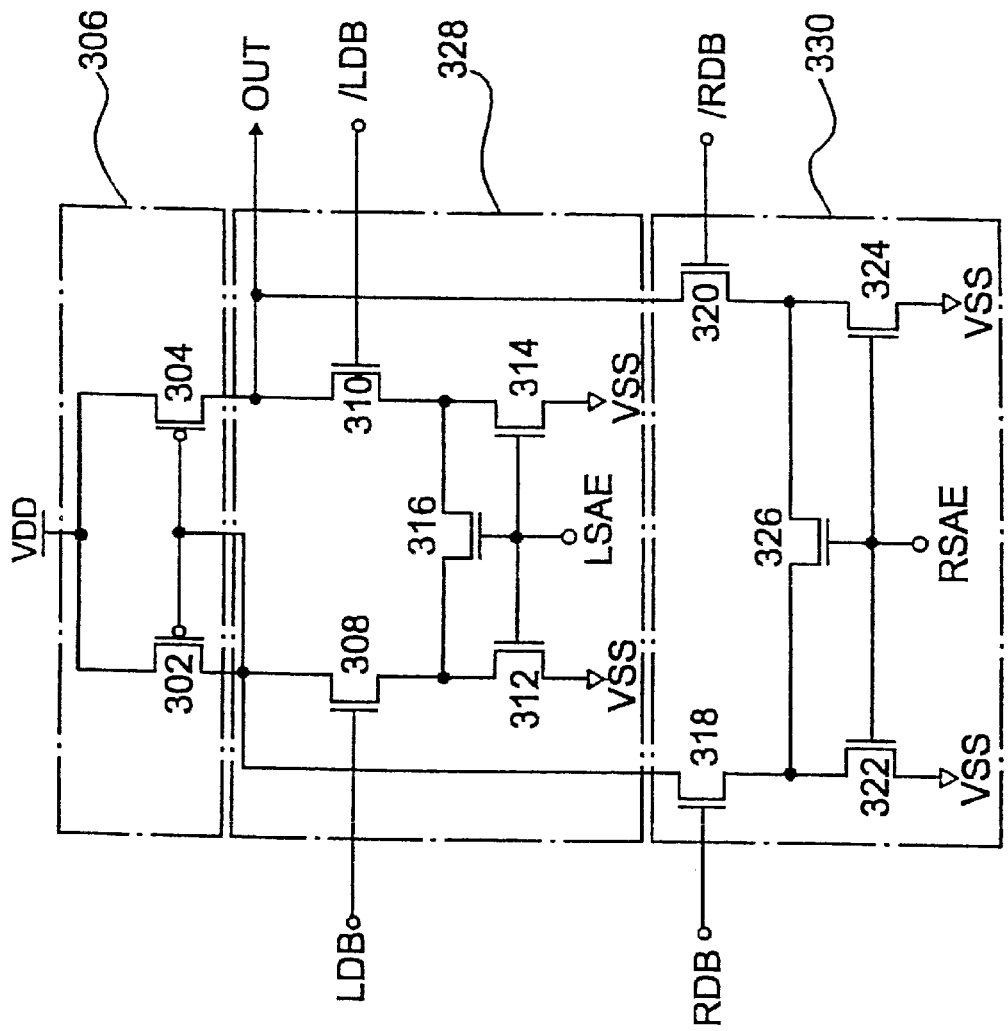
FIG. 6 shows a circuit of a current mirror typed sense amplifier according to a preferred embodiment of the present invention.

FIG. 6 shows a circuit of a current mirror typed sense amplifier according to a preferred embodiment of the present invention. The sense amplifier includes a current mirror type load 306, a first amplifying stage 328 and a second amplifying stage 330. The two amplifying stages 328 and 330 commonly shared a single current mirror type load 306.

The current mirror type load 306 includes two PMOS transistors 302 and 304. The gates of the PMOS transistors 302 and 304 are connected to a drain of the PMOS transistor 302. Further, the drains of the PMOS transistors 302 and 304 are connected to the first and second amplifying stages 328 and 330.

The first amplifying stage 328 includes driving NMOS transistors 308 and 310 and NMOS transistors 312, 314 and 316. The driving NMOS transistors 308 and 310 are connected to the load PMOS transistors 302 and 304, respectively, and are driven by a first data bus signal LDB and a first data bus bar signal /LDB. The NMOS transistors 308 and 310 are also connected to the current source NMOS transistors 312 and 314, which operates as current sources. The NMOS transistor 316 is connected between drains of the two NMOS transistors 312 and 314. The NMOS transistors 312, 314 and 316 are activated by a first sense amplifier enabling signal LSAE. In other words, the NMOS transistor 316 turns on as soon as the two NMOS transistors 312 and 314 are activated, whereby the drains of the NMOS transistors 312 and 314 are electrically equalized.

In this instance, the first data bus and first data bus bar signals LDB and /LDB are data signals read from first memory cell array 102 through a bit line sense amplifier of the bit line sense amplifier circuit 104. The first sense amplifier enabling signal LSAE is a control signal using an address transition detection signal ATD. In this example embodiment, the address transition detection signal ATD is generated from an address input of the memory cell in which the first data bus signals LDB and /LDB have been read. Thus, unnecessary power consumption is prevented by activation of one of the current sources of the sense amplifier, which is restricted based on the address transition detection signal ATD.

The second amplifying stage 330 includes driving NMOS transistors 318 and 320 and NMOS transistor 322, 324 and 326. The driving NMOS transistors 318 and 320 are connected to the drains of the load PMOS transistors 302 and 304, respectively, and are driven by a second data bus signal RDB and a second data bus bar signal /RDB. The driving NMOS transistors 318 and 320 are also connected to the NMOS transistor 322 and 324 which operate as a current source. The NMOS transistor 326 is connected between drains of the two NMOS transistors 322 and 324. The NMOS transistors 322, 324 and 326 are activated by a second sense amplifier enabling signal RSAE. The NMOS transistor 326 is activated when the two NMOS transistors 322 and 324 are activated, whereby the drains of the NMOS transistors 322 and 324 are electrically equalized.

In this example of the preferred embodiment, the second data bus and second data bus bar signals RDB and /RDB are data signals read from a second memory cell array 106 through a bit line sense amplifier of the bit line sense amplifier circuit 108. Like the first sense amplifier enabling signal LSAE, the second sense amplifier enabling signal RSAE is a control signal using the address transition detection signal ATD. The address transition detection signal ATD is generated, for example, from an address input of the memory cell in which the second data bus signals RDB and /RDB have been read. As is the case in the first amplifying stage 328, unnecessary power consumption is prevented by the activation of the current sources of the sense amplifier, which is restricted based on the address transition detection signal.

The first and second amplifying stages 328 and 330 are commonly connect to a single current mirror type load 306 and amplify data signals generated from first and second memory cell arrays. Each amplifying stage has an independent current source to precisely form and similarly limit the length of a signal line between a driving transistor and a current source in a respective amplifying stage.

The sense amplifiers in semiconductor memory require very high sensitivity. If each length of the signal line between the driving transistor and the current source does not conform to the other length, the characteristic of amplifying a pair of the first data bus and data bus bar signals LDB and /LDB may differ greatly from that of amplifying a pair of the second data bus and data bus bar signals RDB and /RDB. As a result, the sensitivity of the sense amplifier may drop abruptly. Accordingly, it is important to match the characteristics of the first amplifying stage 328 with the characteristics of the second amplifying stage 330.

Figure 7:
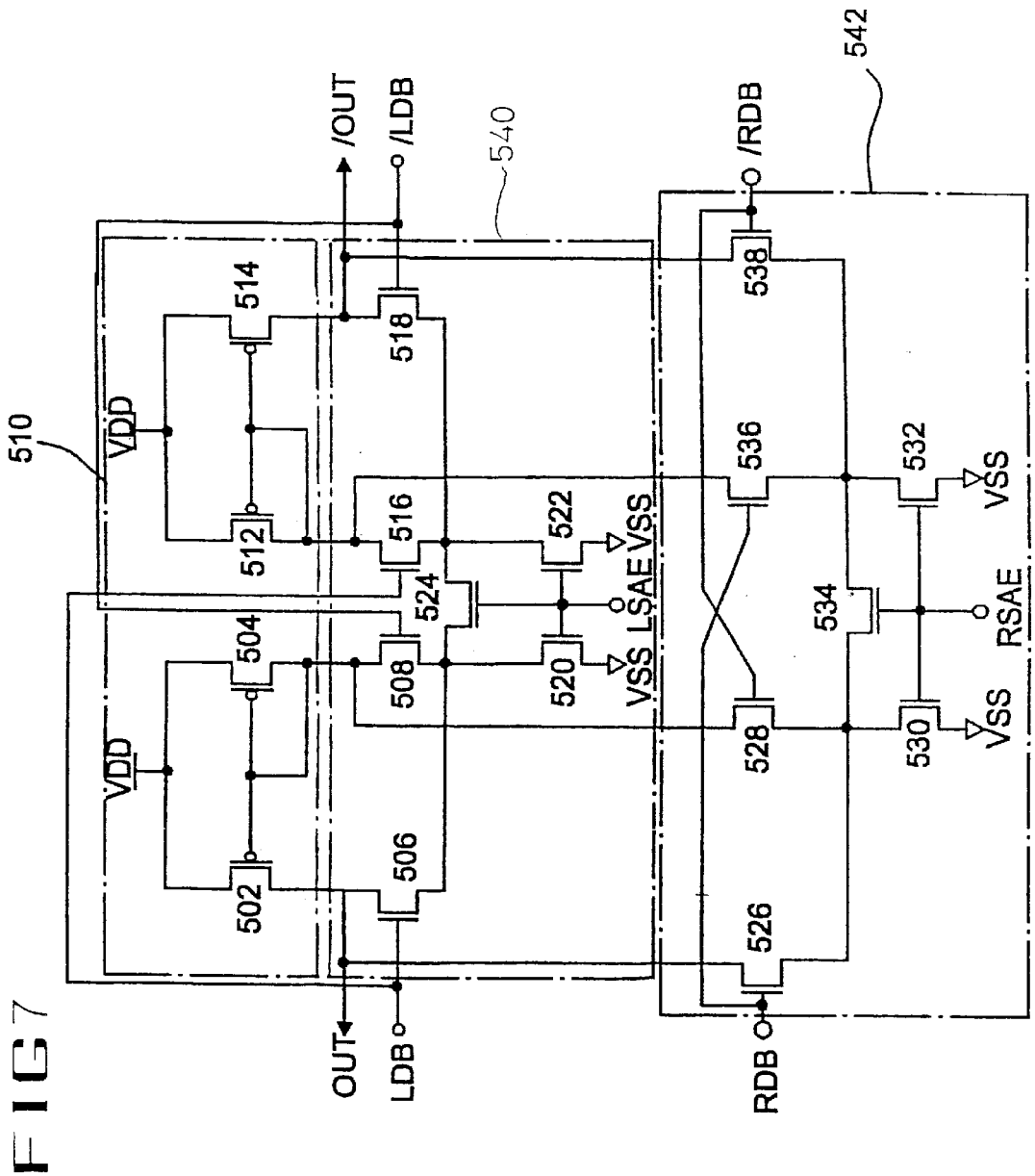
FIG. 7 shows a circuit of a complementary output sense amplifier according to another preferred embodiment of the present invention.

FIG. 7 shows a circuit of a complementary sense amplifier according to another preferred embodiment of the present invention. The sense amplifier shown in FIG. 7 provides complementary outputs by connecting two differential amplifiers in parallel wherein two amplifying stages 540 and 542 commonly share a load 510. The load 510 includes of two current mirror type loads which are commonly shared by the first and second amplifying stages 540 and 542.

Driving transistors of the first amplifying stage 540 include four NMOS transistors 506, 508, 516, and 518 and are driven by a first data bus signal LDB and a first data bus bar signal /LDB which are cross inputted to NMOS transistors 506, 516 and 508, 518, respectively.

In the first differential amplifier of the first amplifying stage 540, the driving NMOS transistor 506 is driven by the first data bus signal LDB and a first output OUT is produced from a drain of the transistor 506. Driving NMOS transistor 508 is driven by the first data bus bar signal /LDB. In the second differential amplifier of the first amplifying stage 540, the driving NMOS transistor 518 is driven by the first data bus bar signal /LDB and a second output /OUT is produced from a drain of the transistor 518. Driving NMOS transistor 516 is driven by the first data bus signal LDB.

The first amplifying stage 540 includes NMOS transistors 520 and 522, which function as the current source. The NMOS transistor 524 is connected between drains of the NMOS transistors 520 and 522. The NMOS transistors 520, 522 and 524 are activated by a first sense amplifier enabling signal LSAE. The NMOS transistor 524 is activated when the NMOS transistors 520 and 522 are activated, whereby the drains of the NMOS transistors 520 and 522 are electrically equalized.

In this example of the preferred embodiment, the second amplifying stage 542 includes four driving NMOS transistors 526, 528, 536, and 538 which are driven by a second data bus signal RDB and a second data bus bar signal /RDB, which are cross inputted.

In the first differential amplifier of the second amplifying stage 542, the driving NMOS transistor 526 is driven by the second data bus signal RDB and a first output OUT is produced from a drain thereof. Driving NMOS transistor 528 is driven by the second data bus bar signal /RDB. In the second differential amplifier of the second amplifying stage 542, the driving NMOS transistor 528 is driven by the second data bus bar signal /RDB and a second output /OUT is produced from a drain thereof. Driving NMOS transistor 536 is driven by the second data bus signal RDB.

The driving NMOS transistors 526,528, 536, and 538 commonly share the load 510 with the driving transistors 506, 508, 516 and 518 of the first amplifying stage 540. Accordingly, the first and second amplifying stages 540, 542 commonly share the same load 510.

The second amplifying stage 542 includes NMOS transistors 530 and 532 which function as the current source. The NMOS transistor 534 is connected between drains of the two current source NMOS transistors 530 and 532. The NMOS transistors 530, 532 and 534 are activated by a second sense amplifier enabling signal RSAE. The NMOS transistor 534 is activated when the two NMOS transistors 530 and 532 are activated, whereby the drains of the NMOS transistors 530 and 532 are electrically equalized.

As mentioned in the above description, the first and second amplifying stages 540 and 542 commonly share the single load 510 and amplify data signals generated from another memory cell block. Each amplifying stage has an independent current source, because the length of a signal line between a driving transistor and a current source in a respective amplifying stage should be precisely formed to improve the sensitivity of the sense amplifier as mentioned in the foregoing description of FIG. 6.

Figure 8:
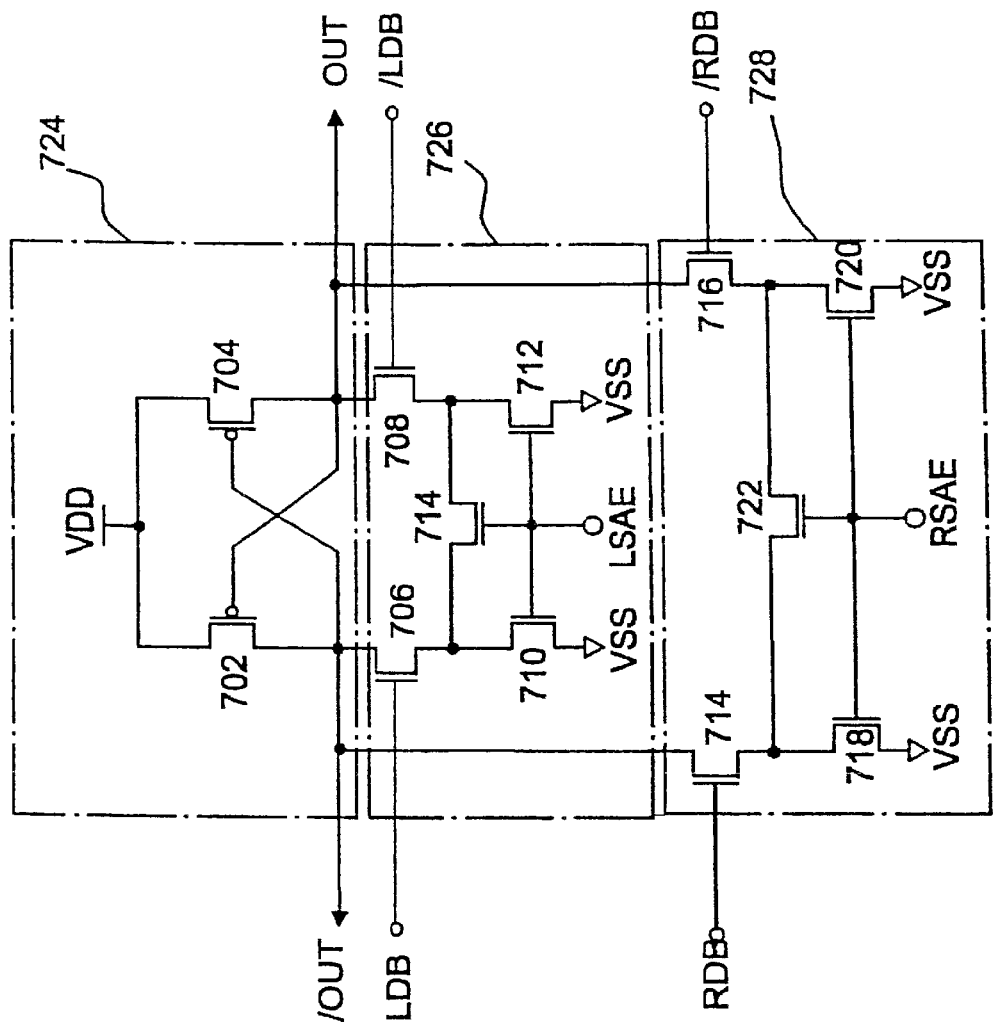
FIG. 8 shows a circuit of a cross-coupled sense amplifier according to yet another preferred embodiment of the present invention.

FIG. 8 shows a circuit of a cross-coupled sense amplifier according to yet another preferred embodiment of the present invention. The sense amplifier in FIG. 8 includes a cross-coupled load 724, a first amplifying stage 726 and a second amplifying stage 728. The amplifying stages 726 and 728 commonly share the load 724.

The cross-coupled load 724 includes two load PMOS transistors 702 and 704. Gates of the load PMOS transistors 702 and 704 are reciprocally connected to the drains of the load PMOS transistors 704 and 702, respectively. The load PMOS transistors 702 and 704 are also connected to the first and second amplifying stages 726 and 728.

The first amplifying stage 726 includes driving NMOS transistors 706 and 708, and NMOS transistor 710, 712 and 714. The driving NMOS transistors 706 and 708 are connected to the load PMOS transistors 702 and 704, respectively, and are driven by a first data bus signal LDB and a first data bus bar signal /LDB. The driving NMOS transistors 706 and 708 are also connected to the NMOS transistors 710 and 712, which operate as the current source. The NMOS transistor 714 is connected between drains of the two NMOS transistors 710 and 712. The NMOS transistors 710, 712 and 714 are activated by a first sense amplifier enabling signal LSAE. The NMOS transistor 714 is turned on when the two NMOS transistors 710 and 712 are activated, whereby the drains of the NMOS transistors 710 and 712 are electrically equalized.

In this example, the first data bus and first data bus bar signals LDB and /LDB are data signals read from the first memory cell array 102 through a bit line sense amplifier of the bit line sense amplifier circuit 104. The first sense amplifier enabling signal LSAE is a control signal using an address transition detection signal ATD which has been generated from an address input of the memory cell in which the first data bus signals LDB and /LDB have been read. Accordingly, unnecessary power consumption is prevented by activating the current sources of the sense amplifier based on the address transition detection signal.

The second amplifying stage 728 includes driving NMOS transistors 715 and 716 and NMOS transfers 718, 720 and 722. The NMOS transistors 715 and 716 are connected to the load 724 with the PMOS transistors 702 and 704, and are driven by a second data bus signal RDB and a second data bus bar signal /RDB. The driving NMOS transistors 715 and 716 are also connected to the NMOS transistors 718 and 720 which operate as the current source. The NMOS transistor 722 is connected between drains of the two NMOS transistors 718 and 720. The three NMOS transistors 718, 720 and 722 are activated by a second sense amplifier enabling signal RSAE. That is, the NMOS transistor 722 is turned on when the two NMOS transistors 718 and 720 are activated, whereby the drains of the NMOS transistors 718 and 720 are electrically equalized.

In this example, the second data bus and second data bus bar signals RDB and /RDB are data signals read from a second memory cell array 106 through a bit line sense amplifier of the bit line sense amplifier circuit 108. The second sense amplifier enabling signal SAE is a control signal based on the address transition detection signal which has been generated from an address input of the memory cell array 106 in which the second data bus signals LDB and /LDB have been read. Accordingly, as is in the first amplifying stage 726, unnecessary power consumption is prevented by the activation of the current sources of the sense amplifier, which is restricted based on the address transition detection signal.

The first and second amplifying stages 726 and 728 are commonly connected to a single cross-coupled load 724 and amplify data signals generated from the first and second memory cell arrays. Each amplifying stage has an independent current source to precisely form and similarly limit the length of a signal line between a driving transistor and a current source in a respective amplifying stage.

The sense amplifiers in semiconductor memory require high sensitivity. If each length of the signal line between the driving transistors and the current sources do not conform to each other, the effect of amplifying a pair of the first data bus and data bus bar signals LDB and /LDB may differ greatly from the effect of amplifying a pair of the second data bus and second data bus bar signals RDB and /RDB. As a result, the sensitivity of the sense amplifier may drop abruptly. Accordingly, it is very important to match the characteristics of the first amplifying stage 726 with the characteristics of the second amplifying stage 728.

Figure 1:
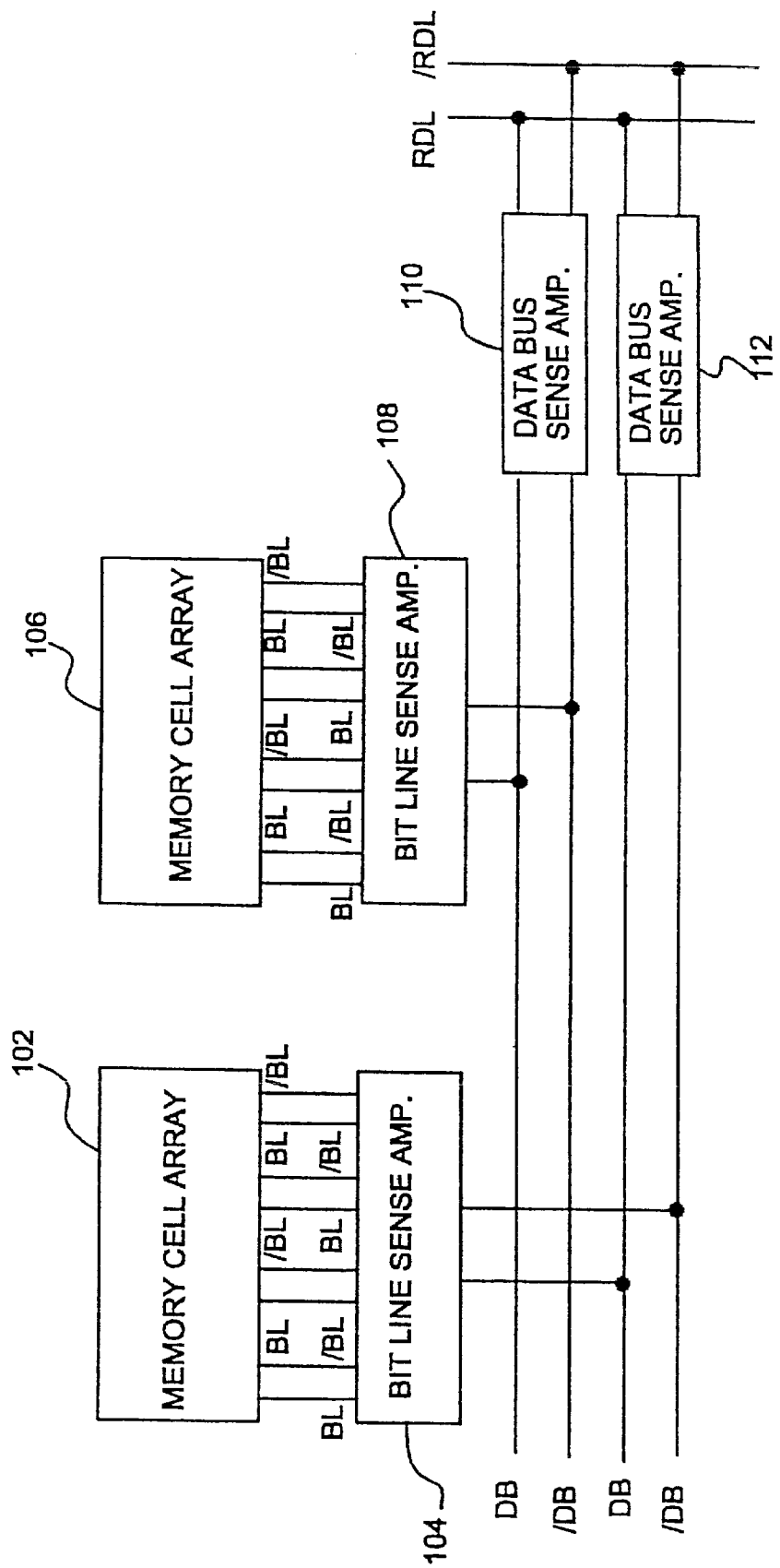
FIG. 1 shows a schematic of a data output path for semiconductor memory according to a related art.
Figure 2:
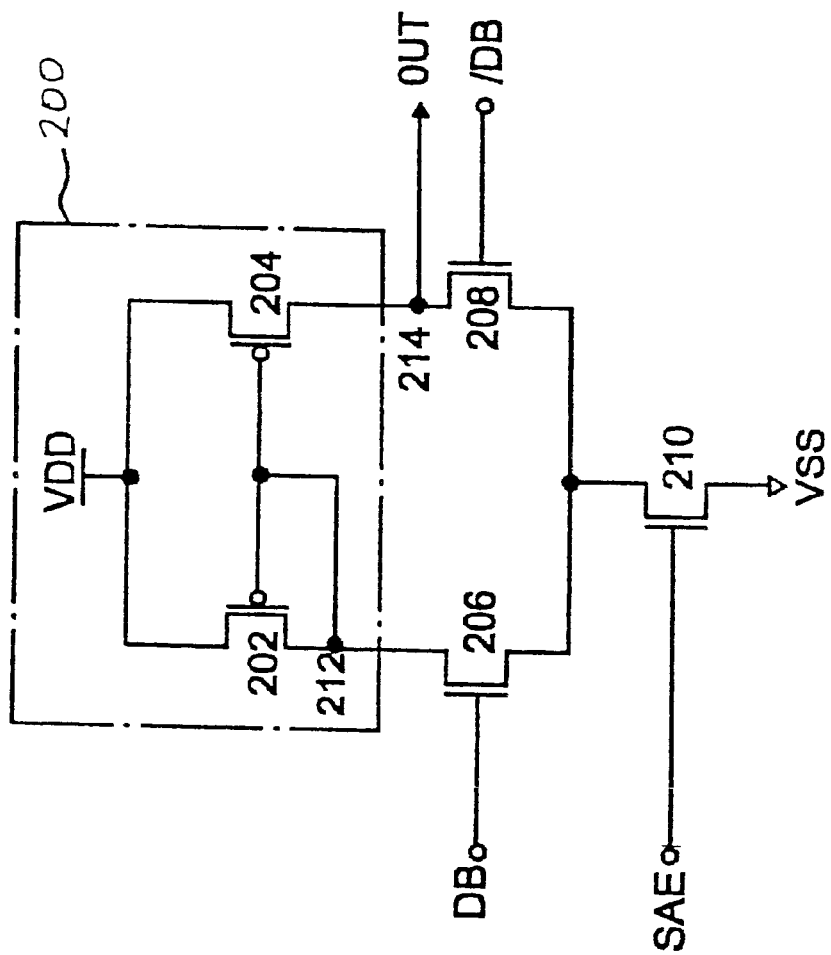
FIG. 2 shows a circuit of a current mirror typed sense amplifier used for a semiconductor integrated circuit according to a related art.
Figure 3:
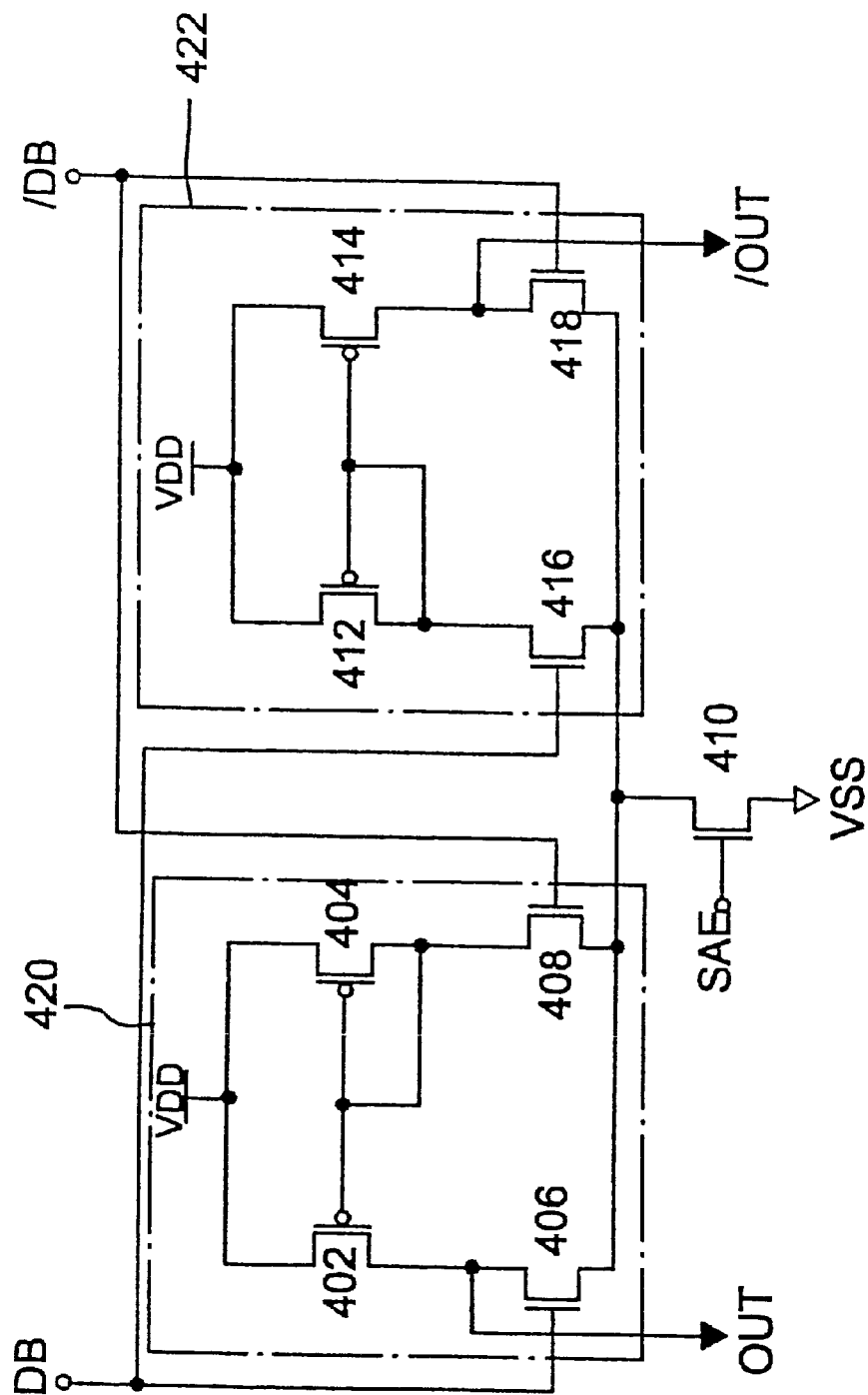
FIG. 3 shows a circuit of a sense amplifier including two differential amplifiers connected in parallel to generate complementary outputs according to a related art.
Figure 4:
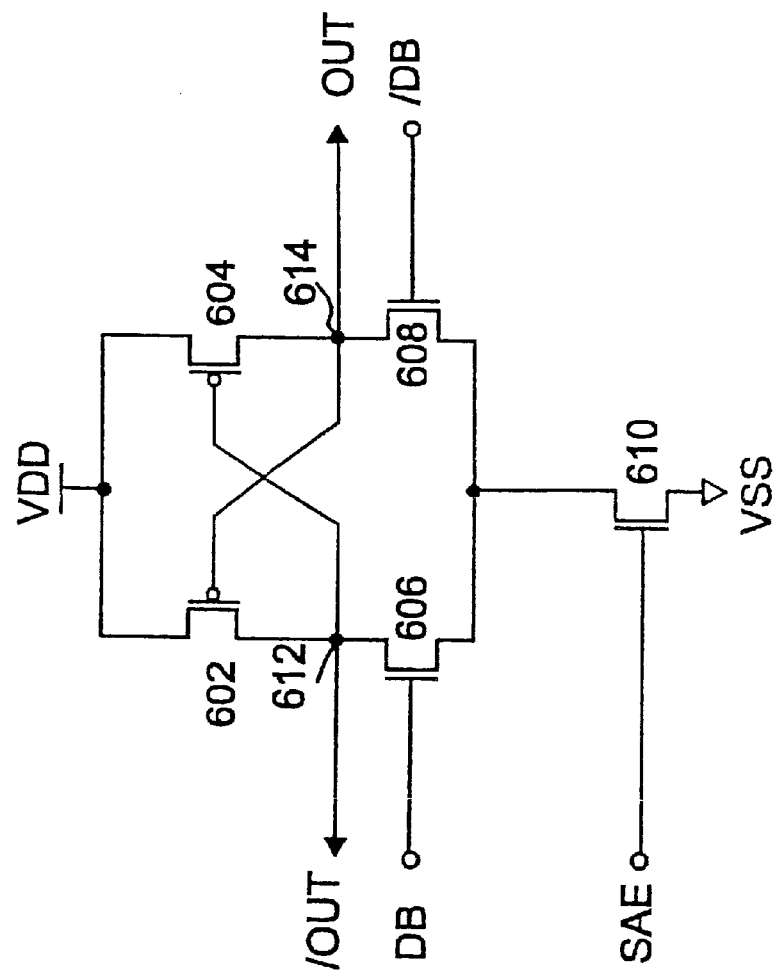
FIG. 4 shows a circuit of a cross-coupled differential amplifier in semiconductor integrated circuit according to a related art.
Figure 5:
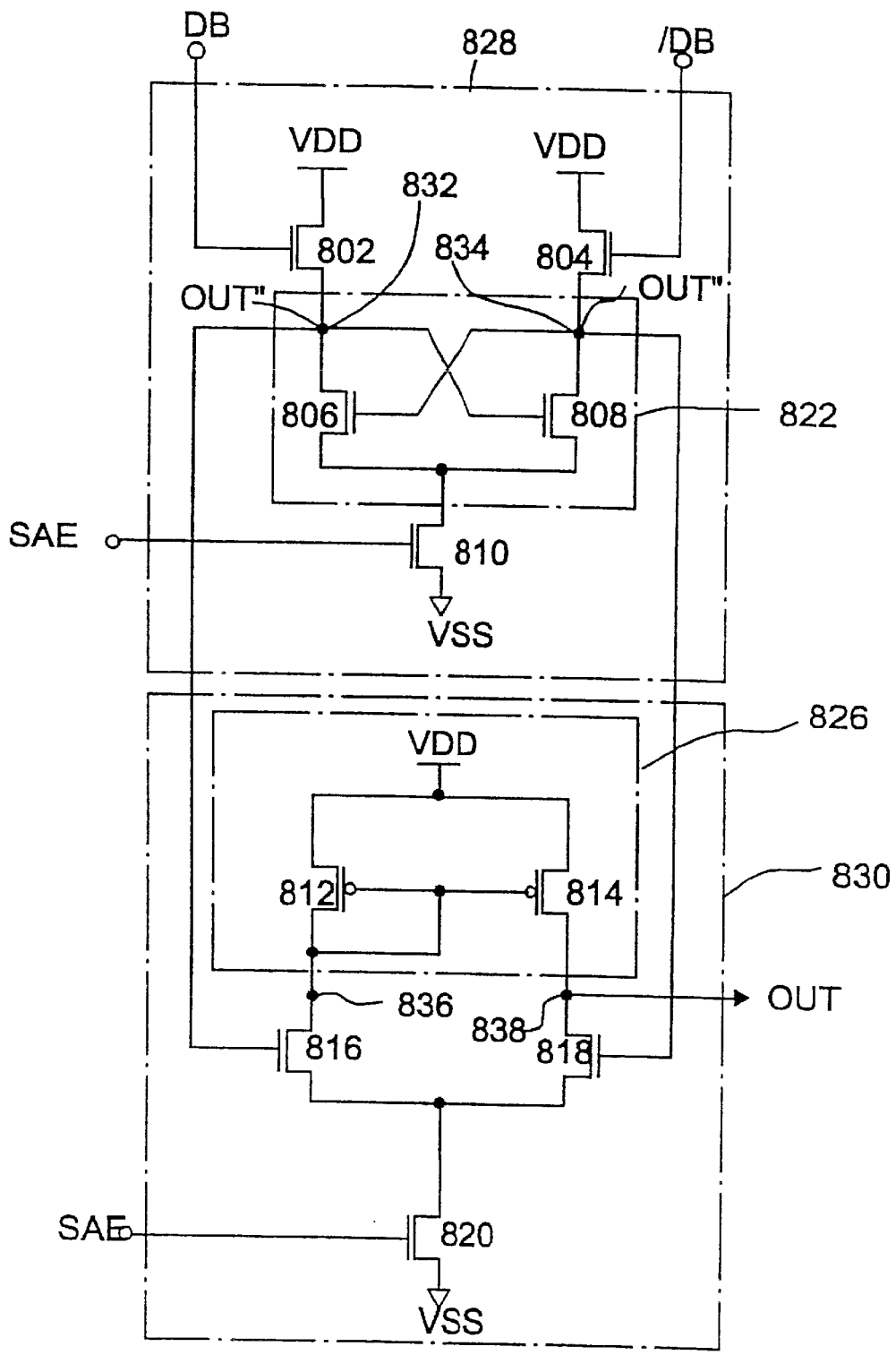
FIG. 5 shows a circuit of a sense amplifier including a level shifter and a current mirror typed differential amplifier according to a related art.
Figure 9:
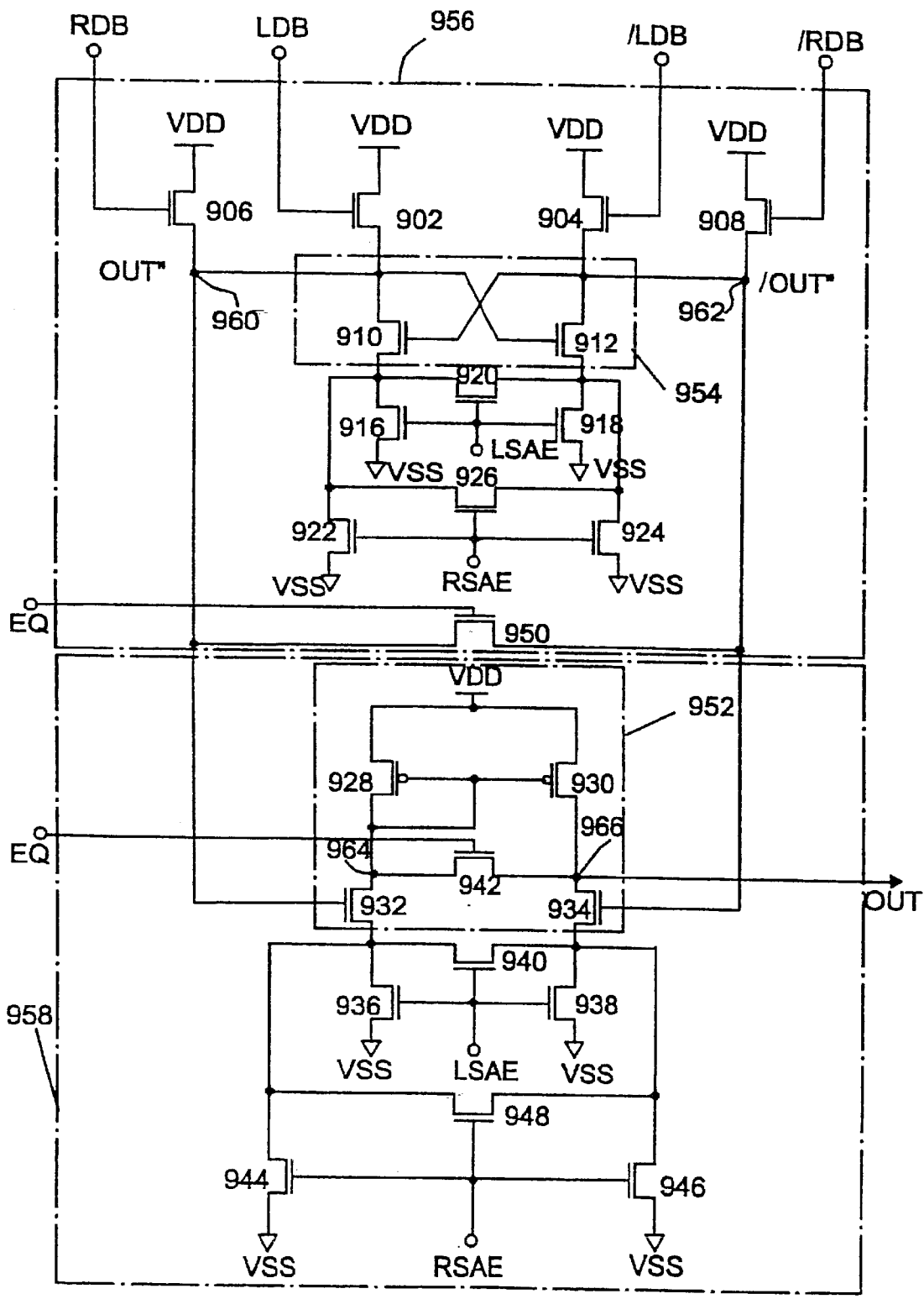
FIG. 9 shows a circuit of a sense amplifier including a level shifter and a current mirror typed differential amplifier according to still another preferred embodiment of the present invention.

FIG. 9 shows a circuit of a sense amplifier including a level shifter and a current mirror typed differential amplifier according to still another preferred embodiment of the present invention. The sense amplifier includes a level shifter 956 and a current mirror type differential amplifier 958. The level shifter 956 is used for fast operating speed with sufficient gain, as mentioned in the above description of FIG. 5.

The level shifter 956 includes four driving transistors 902, 904, 906 and 908, a first load 954 and six NMOS transistors 916, 918, 920, 922, 924 and 926. Two driving NMOS transistors 902 and 904 are driven by a first data bus signal LDB and a first data bus bar signal /LDB, respectively. Two driving NMOS transistors 906 and 908 are driven by a second data bus signal RDB and a second data bus bar signal /RDB, respectively. The four driving NMOS transistors 902, 904, 906 and 908 limit a voltage level at a first or second internal output node 960 or 962 to VDD/2, thus, the four NMOS transistors 902, 904, 906 and 908 are designed to hold a relatively high threshold voltage.

Amplification is performed in the first load 954 which has two load NMOS transistors 910 and 912. The load 954 amplifies a voltage difference between (1) a voltage at a first internal output node 960 according to a drain-source current of the two driving NMOS transistors 906 and 902 and (2) a voltage at a second internal output node 962 according to a drain-source current of the two driving NMOS transistors 904 and 908.

In this example, the level shifter 956 also includes first and second current sources. NMOS transistors 916 and 918 operate as the first current source and have drains connected to NMOS transistor 920. The NMOS transistors 916, 918 and 920 are activated by a first sense amplifier enabling signal LSAE. The NMOS transistor 920 is activated as soon as the two NMOS transistors 916 and 918 are activated, and the drains of the NMOS transistors 916 and 918 are electrically equalized.

NMOS transistors 922 and 924 operate as the second current source, and have drains connected to NMOS transistor 926. The three NMOS transistors 922, 924 and 926 are activated by a second sense amplifier enabling signal RSAE. The NMOS transistor 926 is activated as soon as the two NMOS transistors 922 and 924 are activated, and the drains of the NMOS transistors 922 and 924 are electrically equalized.

Amplifying operation of the level shifter 956 is explained in the following description by an example of inputting a pair of the data bus signals LDB and /LDB to the level shifter 956.

When the sense amplifier enabling signal SAE is activated, a drain-source current $I_{DS}$ of the driving NMOS transistor 902 is larger than the drain-source current $I_{DS}$ of the driving NMOS transistor 904 if a voltage level of the first data bus signal LDB which drives the driving NMOS transistor 902 is a voltage difference ΔV higher than a voltage level of the data bus bar signal /LDB of the driving NMOS transistor 904. Accordingly, the voltage at the first internal output node 960 is relatively higher than the voltage at the second internal output node 962.

Voltage of the first internal output node 960 keeps on rising until a threshold voltage of the load NMOS transistor 912 rises over the threshold voltage VTN. Then, the load NMOS transistor 912 is turned off. Accordingly, voltage of the second internal output node 962 drops down to 0 volts. Once the voltage of the second internal output node 962 falls to 0 volts, the load NMOS transistor 910 is turned off. Thus, the voltage of the first internal output node 960 rises up to VDD/2. In other words, the small voltage difference ΔV between the first data bus signal LDB and the first data bus bar signal /LDB is amplified up to VDD/2 and the voltage difference ΔV becomes the difference between a first internal output OUT" and a second internal output /OUT". The current mirror type differential amplifier 958 amplifies the first internal output OUT" and the second internal output /OUT" outputted from the level shifter 956.

The second load 952 includes two driving NMOS transistors 932 and 934, and two load PMOS transistors 928 and 930 which form a current mirror type load. The driving NMOS transistors 932 and 934 are driven by the first and second internal output OUT" and /OUT", respectively, and are connected to third and fourth current sources.

The third current source includes NMOS transistors 936 and 938, which operate as the current source and have drains connected to NMOS transistor 940. The NMOS transistors 936, 938 and 940 are activated by a first sense amplifier enabling signal LSAE such that the NMOS transistor 940 becomes activated when the two NMOS transistors 936 and 938 are activated, and thus the drains of the NMOS transistors 936 and 938 are electrically equalized.

The fourth current source includes NMOS transistors 944 and 946, which operate as the current source and have drains connected to NMOS transistor 948. The NMOS transistors 944, 946 and 948 are activated by a second sense amplifier enabling signal RSAE such that the NMOS transistor 948 is activated when the two NMOS transistors 944 and 946 are activated, and the drains of the NMOS transistors 944 and 946 are electrically equalized.

The first data bus and first data bus bar signals LDB and /LDB are data signals read from the first memory cell array 102 through a bit line sense amplifier of the bit line sense amplifier circuit 104. The first sense amplifier enabling signal LSAE is a control signal based on an address transition detection signal ATD generated from an address input of the memory cell in which the first data bus signals LDB and /LDB have been read.

The second data bus and second data bus bar signals RDB and /RDB are data signals read from the second memory cell array 106 through a bit line sense amplifier of the bit line sense amplifier circuit 108. The second sense amplifier enabling signal RSAE is a control signal based on an address transition detection signal ATD generated from an address input of the memory cell in which the second data bus signals RDB and /RDB have been read. Accordingly, unnecessary power consumption is prevented by the activation of the current sources of the sense amplifier, which is restricted based on the address transition detection signal ATD.

Each current passing through output nodes 964 and 966 is equal to each other because of the current mirror type load 952. Thus, the current sinking through the first or second current source to a ground VSS remains constant.

Each current passing through the driving NMOS transistors 932 and 934 depends on voltage levels of the first and second internal outputs OUT" and /OUT", respectively. When the voltage level of the first internal output OUT" is higher than the voltage of the second internal output /OUT", drain-source current $I_{DS}$ of the NMOS transistor 932 increases relatively to lower the voltage at the node 964. On the other hand, drain-source current $I_{DS}$ of the driving NMOS transistor 934 lessens relatively, while voltage of the node 966 which is an output OUT rises. Namely, small voltage difference between a pair of the first and second internal outputs OUT" and /OUT" is amplified to a level of VDD.

Two NMOS transistors 950 and 942 switched by an equalization control signal EQ in FIG. 9 equalize the internal output nodes 960 and 962 of the level shifter 956 and the output nodes 964 and 966 of the differential amplifier 958. The equalization control signal EQ is generated by using the address transition detection signal ATD. Namely, equalization is completed as soon as the address transition detection signal ATD is activated to a high level. Such equalization is necessary for preventing data signals which are unnecessary for each driving transistor before data signals to be amplified are inputted.

The preferred embodiments of the present invention, the sense amplifier, have been described in relation to the data bus sense amplifiers. However, the preferred embodiments are readily applicable to bit line as well as all the other sense amplifiers in semiconductor integrated circuitry. At least three input signals are able to be amplified by increasing the number of driving transistors and current sources.

A sense amplifier according to the present invention decreases the area of an unit sense amplifier by having at least two sense amplifiers own a single load in common in semiconductor memory based on a current mirror typed differential amplifier or a cross-coupled differential amplifier. Thus, the amplifier area is decreased in the semiconductor memory, which allows for the implementation of many sense amplifiers.

Especially, as the area according to a load of an unit sense amplifier increases due to the complicated construction of a sense amplifier requiring both high operation speed and high sensitivity, the benefit of reducing amplifier area is doubled by having the load of the sense amplifier commonly owned.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An amplifier, comprising:
   a level shifter; and an amplifying unit coupled to the level shifter, wherein the level shifter includes:

(a) a first driver which limits voltages at a first node and a second node;
(b) a first load, coupled to the first driver, which amplifies a difference between the voltages at the first node and the second node;
(c) a first current source coupled to the first load and enabled by a first control signal; and
(d) a second current source coupled to the first load and enabled by a second control signal, wherein the amplifying unit includes a second load coupled to the first and second nodes, and a sense amplifier responsive to an output of the level shifter, wherein the level shifter further includes a second driver which limits the voltages at the first and second nodes, and wherein the first driver includes a plurality of first driver transistors responsive to a first data bus signal and a first data bus bar signal, and the second driver includes a plurality of second driver transistors responsive to a second data bus signal and a second data bus bar signal.

2. The amplifier of claim 1, wherein each of the first driver transistors and the second driver transistors include a first electrode, a second electrode and a control electrode, the first electrode for coupling to a first voltage potential, the second electrode coupled to the first load and to one of an output signal and an output bar signal of the output of the level shifter, and the control electrode coupled to a respective one of the first data bus signal, first data bus bar signal, second data bus signal and second data bus bar signal.

3. An amplifier, comprising:
a level shifter; and
an amplifying unit coupled to the level shifter, wherein the level shifter includes:
(a) a first driver which limits voltages at a first node and a second node;
(b) a first load, coupled to the first driver, which amplifies a difference between the voltages at the first node and the second node;
(c) a first current source coupled to the first load and enabled by a first control signal; and
(d) a second current source coupled to the first load and enabled by a second control signal, wherein the amplifying unit includes a second load coupled to the first and second nodes, and a sense amplifier responsive to an output of the level shifter, and wherein the sense amplifier further includes:
an amplifying unit driver responsive to the output of the level shifter;
a third current source coupled to a voltage potential and enabled by the first control signal, and
a fourth current source coupled to the voltage potential and enabled by the second control signal, wherein the third current source and the fourth current source is coupled to the amplifying unit driver.

4. The amplifier of claim 3, wherein each of the first and third current sources includes a switch for controlling activity of the respective current source based on a first control signal, and each of the second and fourth current sources include a switch for controlling activity of the respective current source based on a second control signal.

5. The amplifier of claim 4, wherein the level shifter includes a switch for controlling the output of the level shifter according to a third control signal, and the sense amplifier includes a switch for controlling a sense amplifier output according to the third control signal.

6. The amplifier of claim 3, wherein the output of the level shifter is a first output signal and a first output bar signal, and the amplifying unit driver includes a plurality of amplifying unit driver transistors responsive to the first output signal and the first output bar signal.

7. The Amplifier of claim 6, wherein the third current source includes a plurality of third current source transistors connected to the amplifying unit driver transistors, and the fourth current source includes a plurality of fourth current source transistors connected to the amplifying unit driver transistors.

8. An amplifier comprising:
a level shifter connected to a pair of data bus signals; and
an amplifying unit coupled to the level shifter,
wherein the level shifter includes:
a first driver which limits a level of a voltage potential;
a first load which is coupled to the first driver and which amplifies a voltage difference between the pair of data bus signals to a value proportional to the voltage potential, said voltage difference existing relative to first and second nodes of the level shifter;
a first current source coupled to the first load and enabled by a first control signal;
a second current source coupled to the first load and enabled by a second control signal;
a second driver coupled to the first and second nodes and responsive to a second pair of data bus signals; and
an amplifying unit which is connected to the first load and which amplifies a difference between the voltages at the first node and the second node to equal said supply voltage.

9. The amplifier of claim 8, wherein the amplifying unit amplifies a voltage difference between the second pair of data bus signals.

10. An amplifier, comprising:
a level shifter connected to two pairs of data bus signals; and
an amplifying unit coupled to the level shifter,
wherein the level shifter includes:
a first driver which limits a level of a voltage potential by one pair of data bus signals;
a second driver which limits the level of the voltage potential by the other pair of data bus signals;
a first load which is coupled to the first driver and amplifies the voltage difference between one pair of the two pairs of data bus signals to a predetermined fraction of a supply voltage, said voltage difference existing relative to first and second nodes of the level shifter;
a first current source coupled to the first load and enabled by a first control signal;
a second current source coupled to the first load and enabled by a second control signal, wherein the first control signal is not enabled while the second control signal is enabled, and
wherein the amplifying unit includes:
a second load coupled to the first and second nodes and a sense amplifier responsive to an output of the level shifter.

* * * * *